(12) United States Patent
Xiao et al.

(10) Patent No.: US 11,134,240 B2
(45) Date of Patent: Sep. 28, 2021

(54) DEVICE AND METHOD FOR DETERMINING A FINGERPRINT FOR A DEVICE USING A VOLTAGE OFFSET DISTRIBUTION PATTERN

(71) Applicant: Sony Semiconductor Solutions Corporation, Kanagawa (JP)

(72) Inventors: Sa Xiao, Stuttgart (DE); Jean-Luc Loheac, Stuttgart (DE); Ward Van Der Tempel, Stuttgart (DE); Rachit Mohan, Stuttgart (DE)

(73) Assignee: Sony Semiconductor Solutions Corporation, Kanagawa (JP)

( * ) Notice: Subject to any disclaimer, the term of this patent is extended or adjusted under 35 U.S.C. 154(b) by 0 days.

(21) Appl. No.: 16/013,405

(22) Filed: Jun. 20, 2018

(65) Prior Publication Data

US 2018/0376135 A1    Dec. 27, 2018

(30) Foreign Application Priority Data

Jun. 21, 2017    (EP) .................................... 17177253

(51) Int. Cl.
| | | |
|---|---|---|
| *H04N 17/00* | (2006.01) | |
| *H01L 23/544* | (2006.01) | |
| *H04N 5/3745* | (2011.01) | |
| *G06F 17/18* | (2006.01) | |

(52) U.S. Cl.
CPC ......... *H04N 17/002* (2013.01); *H01L 23/544* (2013.01); *H04N 5/37455* (2013.01); *G06F 17/18* (2013.01); *H01L 2223/5444* (2013.01)

(58) Field of Classification Search
CPC ............. H04N 17/002; H04N 5/37455; H04N 5/3653; H01L 23/544; H01L 2223/5444; G06F 17/18
See application file for complete search history.

(56) References Cited

U.S. PATENT DOCUMENTS

| | | | | |
|---|---|---|---|---|
| 7,129,973 B2* | 10/2006 | Raynor | ............... | H04N 1/32128 348/231.3 |
| 7,663,670 B1* | 2/2010 | Orboubadian | ....... | H04N 9/8042 348/231.2 |
| 8,280,098 B2* | 10/2012 | Yadid-Pecht | ...... | H04N 1/32165 382/100 |
| 8,736,714 B2* | 5/2014 | Ordoubadian | ....... | H04N 9/8042 348/231.2 |
| 2002/0021837 A1 | 2/2002 | Suzuki | | |
| 2004/0053429 A1 | 3/2004 | Muranaka | | |

(Continued)

FOREIGN PATENT DOCUMENTS

| | | |
|---|---|---|
| EP | 0853433 A1 | 7/1998 |
| JP | 05-013387 B1 | 8/2012 |

OTHER PUBLICATIONS

Kurosawa et al., CCD Fingerprint Method—Identification of a Video Camera from Videotaped Images. IEEE. 1999:537-40.

*Primary Examiner* — John W Miller
*Assistant Examiner* — Humam M Satti
(74) *Attorney, Agent, or Firm* — Wolf, Greenfield & Sacks, P.C.

(57) ABSTRACT

A device has a plurality of analog-to-digital converters. Each of the plurality of analog-to-digital converters has a voltage offset, wherein a predefined set of voltage offsets has a voltage offset distribution pattern, which provides a fingerprint for the device.

20 Claims, 10 Drawing Sheets

(56) References Cited

U.S. PATENT DOCUMENTS

| | | | |
|---|---|---|---|
| 2007/0152863 A1* | 7/2007 | Le | H03M 1/1023 |
| | | | 341/155 |
| 2013/0278796 A1 | 10/2013 | Ordoubadian | |
| 2014/0027611 A1* | 1/2014 | Patel | H04N 5/361 |
| | | | 250/208.1 |
| 2016/0329906 A1* | 11/2016 | Patukuri | G01S 17/894 |
| 2017/0104949 A1* | 4/2017 | Kim | H04N 5/335 |
| 2017/0272740 A1* | 9/2017 | Clark, II | H04N 5/357 |
| 2018/0060738 A1* | 3/2018 | Achin | G06Q 10/04 |
| 2018/0063457 A1* | 3/2018 | Shimamura | H04N 5/3698 |
| 2018/0115723 A1* | 4/2018 | Takayanagi | H04N 5/225 |
| 2018/0329962 A1* | 11/2018 | Schrijen | G06F 16/2468 |

* cited by examiner

US 11,134,240 B2

DEVICE AND METHOD FOR DETERMINING A FINGERPRINT FOR A DEVICE USING A VOLTAGE OFFSET DISTRIBUTION PATTERN

CROSS REFERENCE TO RELATED APPLICATIONS

This application claims the benefit of European Priority Patent Application EP 17177253.6 filed Jun. 21, 2017, the entire contents of which are incorporated herein by reference.

TECHNICAL FIELD

The present disclosure generally pertains to a device including a plurality of analog-to-digital converters and a method for determining a fingerprint for the device and identifying the device.

TECHNICAL BACKGROUND

Known methods for semiconductor device identification are typically based on, for example, storing identification information of the semiconductor devices in integrated non-volatile memories, etching of external layers of the semiconductor devices, e.g., by using a laser or an electron beam for altering the external layers and engraving predefined serial numbers on the external layers of the semiconductor devices, using an optical imaging technique for obtaining the engraved serial numbers and storing the predefined serial numbers on, e.g., a database, etc.

Existing technologies for identification of semiconductor devices may involve extra costs for providing additional means, such as a specific memory, or the like, which may result in, for example, an extra consumption of silicon, a larger size of the device, an exceptional design of the device, etc.

Furthermore, identification information for identification of the semiconductor device is known to be stored in a memory which may be user controlled and may be fraudulently modified.

Furthermore, for traceability purposes of a semiconductor device, it is useful to provide a unique fingerprint.

Although there exist techniques for assigning identification information to semiconductor devices and storing the identification information, e.g., in non-volatile memories, it is generally desirable to propose a device and a method, which provides identification of a semiconductor device.

SUMMARY

According to a first aspect, the disclosure provides a device including a plurality of analog-to-digital converters, each of the plurality of analog-to-digital converters having a voltage offset, wherein a predefined set of voltage offsets has a voltage offset distribution pattern providing a fingerprint for the device.

According to a second aspect, the disclosure provides a method including determining a fingerprint for a device including a plurality of analog-to-digital converters, based on a voltage offset distribution pattern of a predefined set of voltage offsets provided by the plurality of analog-to-digital converters.

Further aspects are set forth in the dependent claims, the drawings and the following description.

BRIEF DESCRIPTION OF THE DRAWINGS

Embodiments are explained by way of example with respect to the accompanying drawings, in which.

DETAILED DESCRIPTION OF EMBODIMENTS

Figure 1:
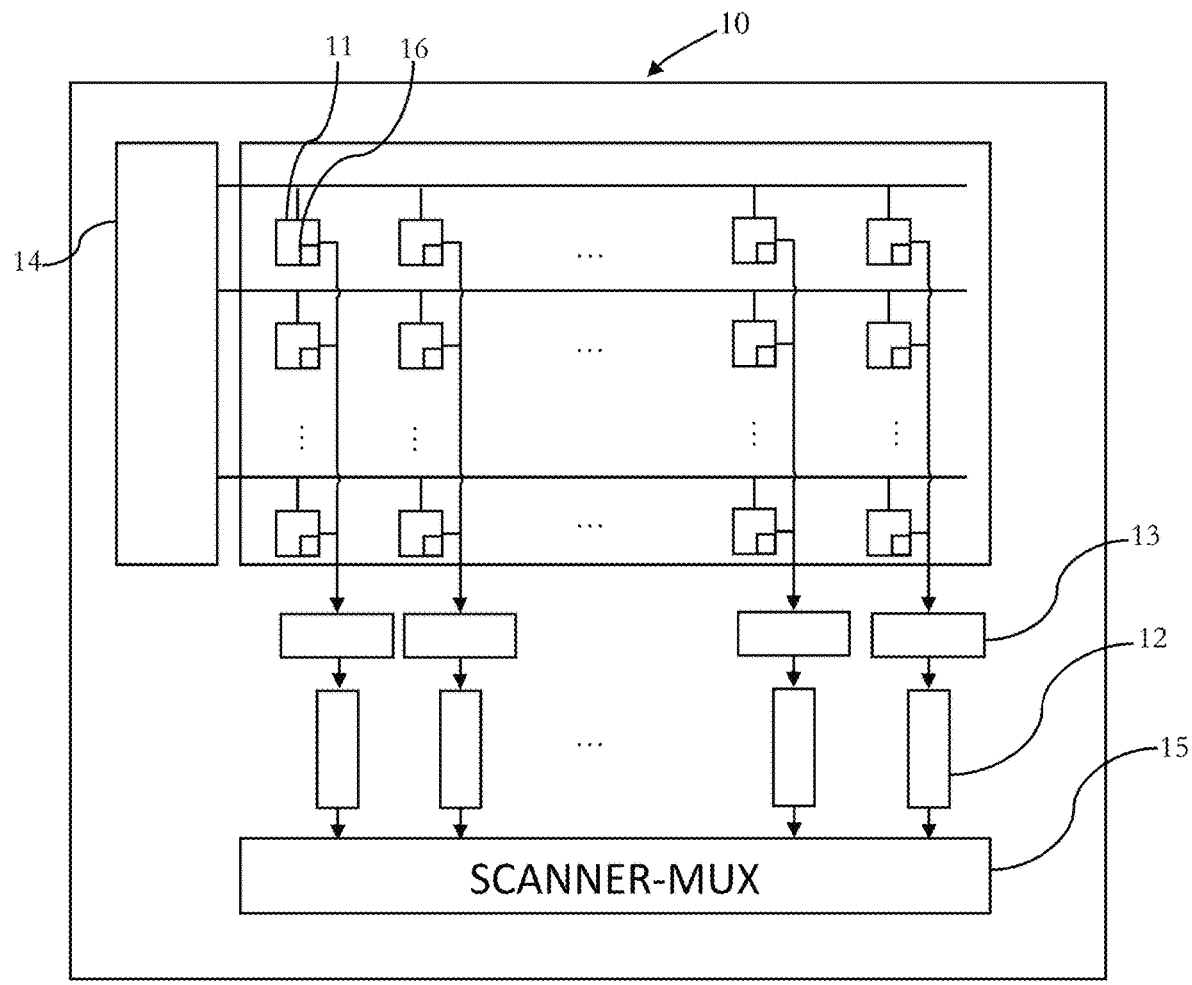
FIG. 1 illustrates an embodiment of a semiconductor device, which has a plurality of analog-to-digital converters.

Before a detailed description of the embodiments under reference of FIG. 1 is given, general explanations are made.

As mentioned in the outset, generally, known technologies, which are used for identification of semiconductor devices may be based on, e.g., writing a code into a programmable non-volatile memory and the like, wherein the code may uniquely identify the semiconductor device.

It has been recognized that using an integrated memory for storing of identification information consumes a significant part of the semiconductor device area and results in, e.g., an additional cost, increase of power consumption, etc.

Consequently, some embodiments pertain to a device comprising a plurality of analog-to-digital converters, each of the plurality of analog-to-digital converters having a voltage offset, wherein a predefined set of voltage offsets has a voltage offset distribution pattern providing a fingerprint for the device.

The fingerprint may be a unique pattern, a unique mark, a unique serial number, a unique identifying number or group of numbers, etc., associated with the device, which may be, for example, a sensor, an image sensor, a time-of-flight (ToF) sensor, a semiconductor chip, an integrated circuit, etc.

Moreover, the fingerprint may be used to identify the device, for example, the fingerprint of an image sensor may be used and the image sensor may be individually identified. Similarly, the fingerprint of a semiconductor chip may be used and the semiconductor chip may be identified, or the like.

Furthermore, in some embodiments the device may be traced by using the provided fingerprint. For instance, a fingerprint of an image sensor may be used as an identification information for the image sensor, and the image sensor may be traced.

In some embodiments, the fingerprint may be used to trace or to track the history of the device, for example, tracing a time-of-flight sensor from, e.g., its fabrication to its current application, tracing (tracking) the time-of-flight sensor for quality control, etc.

Moreover, the tracing of the device may be, for example, determining the wafer material, identifying the manufactured location of the device, determining the lot information, tracking different test conditions of the device, tracking packaging information, determining the history of the device (e.g. measurement conditions, analysis of the measurements, or the like), etc.

In some embodiments, the fingerprint of the device may be used and the different production stages of the device may be tracked, for example, from, e.g., fabrication to test, fabrication to packaging, fabrication to reliability analysis, fabrication to final product, or the like.

In some embodiments, the provided fingerprint of the device may be used and the quality of the device may be improved. For example, the fingerprint of a semiconductor chip may be used and its early life failure may be reduced, hence, the quality of the semiconductor chip may be improved. Moreover, the fingerprint of the device may be used, the device may be traced and systematic problems of the device may be analyzed, or the like.

Hence, some embodiments provide a method for determining a fingerprint for the device, some embodiments provide a method for obtaining identification information of the device, some embodiments provide a method for tracing the device, some embodiments provide a method for determining a fingerprint for a device based on the voltage offsets of the plurality of analog-to-digital converters, and/or some embodiments provide a method for tracing a device based on the voltage offsets of the plurality of analog-to-digital converters. The device may be any type of electronic device, which has a plurality of analog-to-digital converters (ADCs). In some embodiments, the device is a semiconductor device, such as an image sensor, e.g., a complementary metal-oxide-semiconductor (CMOS) sensor, a charge-coupled device (CCD) sensor, a time-of-flight sensor, etc., without limiting the present disclosure in that regard. The image sensor may include one or more photoelectric conversion elements, which may be arranged in an array, or the like, wherein one or more of the plurality of analog-to-digital converters may be associated with one (or more) of the photoelectric conversion elements.

In some embodiments, the image sensor may have a plurality of pixels. The pixels may include, for example, photo detectors for generating photoelectrons based on the light impinging on the photo detector. The pixels may further be configured to generate an analog signal corresponding to an intensity of light impinged on the photo detector.

In some embodiments, each pixel may include an analog-to-digital converter, while in other embodiments, a plurality of pixels may be connected to one or a plurality of ADCs, wherein each analog-to-digital converter may further be configured to sample a corresponding input analog signal and convert the input analog signal to a digital signal. The plurality of ADCs may be directly integrated, e.g., in the plurality of pixels and/or may be arranged in a parallel bank of converters. The image sensor may have any number of ADCs and may further be specifically designed to reduce the readout rate and to achieve low power consumption. Moreover, the image sensor may further include additional elements such as a plurality of photo-detectors, activation code generators, scanner, and a plurality of analog signal multiplexers, etc. The image sensor may be manufactured on a single integrated circuit chip or may be fabricated as a plurality of circuits and then may be assembled.

The image sensor may be produced, for example, by a complementary metal-oxide-semiconductor (CMOS) process and may include two-dimensional, three-dimensional pixel arrays, etc. The image sensor may be used in digital imaging devices, e.g., in a digital camera, in a smartphone, in a tablet computer, or the like.

In some embodiments, an analog signal generated by, e.g., a pixel of the image sensor is sent to an analog-to-digital converter. The analog-to-digital converters may be configured to convert an analog signal, e.g., from a photoelectric conversion element, an audio element, or the like, to a digital signal.

Generally, several analog-to-digital converters are known using different principles, such as direct conversion, successive approximation, ramp comparison, or the like, and the present disclosure is not limited to a specific type of analog-to-digital converters.

In some embodiments, the plurality of analog-to-digital converters includes two analog-to-digital converters, while in other embodiments several tenth, hundreds or thousands, or even more, analog-to-digital converters are included in the plurality of analog-to-digital converters.

Moreover, the device may include more analog-to-digital converters than the plurality of analog-to-digital converters, such that in some embodiments the plurality of analog-to-digital converters is a predefined set of analog-to-digital converters based on the analog-to-digital converters which are located on the device.

Moreover, each of the plurality of analog-to-digital converters has a voltage offset. The voltage offset of the analog-to-digital converter may be the result of a difference in voltage between outputs of two operations. The operations may be, converting an analog signal from a photoelectric conversion element to a digital signal, converting an analog signal from an audio element to a digital signal, etc. Moreover, an intrinsic resistance, or the like, may cause the voltage offset.

Moreover, each analog-to-digital converter may have an individual voltage offset. The voltage offsets of the plurality of ADCs are associated with, for example, image sensor processing, number of channels of the ADCs, e.g., being a one channel analog-to-digital converter, being a two channels analog-to-digital converter, etc., type of interfaces, e.g., having a parallel interface, a serial interface, etc., composition, production method, supply voltage, and the like. Moreover, the source of voltage offset may be the device itself, the design of the device, the position of the analog-to-digital converters, the temperature of the device and the like, e.g., the temperature of the image sensor may affect the charge distribution in the analog-to-digital converter, etc. Moreover, the voltage offset may further vary, for example, with environment temperature, etc.

In some embodiments, a predefined set of voltage offsets has a voltage offset distribution pattern. The voltage offset distribution pattern may be a pattern formed by the tendency of the predefined set of voltage offsets to group themselves around, e.g., a central value, a central line, a central plane, etc. For instance, in a linear voltage offset distribution pattern, the voltage offsets may be uniformly distributed on both sides of a line, etc. The voltage offset distribution pattern may also be completely random and the pattern may indicate the specific distribution of the voltage offsets of the specific set of voltage offsets. Moreover, in some embodiments, the voltage distribution may be random.

In some embodiments, the voltage offset distribution pattern provides a fingerprint for the device.

As discussed above, each analog-to-digital converter may have an individual voltage offset. In some embodiments, the voltage offsets of the plurality of ADCs are distributed within a specific value range, for example, of −60 mV and +60 mV without limiting the present disclosure in that regard. As a result, each analog-to-digital converter and consequently the plurality of ADCs have random voltage offsets. The voltage offset distribution of the plurality of ADCs, may be a Gaussian random field like distribution, a Conditional random field like distribution, a Gibbs random field like distribution, a Markov random field like distribution, or the like. Therefore, a predefined set of voltage offsets may have a voltage offset distribution pattern, which may be random and, as it is random, may be unique to the device, which has the plurality of ADCs and, thus, may be used as a fingerprint for the device comprising the plurality of ADCs. Therefore, the voltage offset distribution pattern provides a fingerprint for the device, as discussed above. In other words, if the voltage offsets of the plurality of ADCs of the device are determined, a fingerprint for the device may be determined.

The fingerprint may be represented by data, which in turn represent the predefined set of voltage offsets. The fingerprint of the device is, for example, a distinctive number associated with the device and may be dependent on physical characteristics of the device such as, device processing, composition, electronic circuit configuration, and the like. The fingerprint of the device, which is provided by the voltage offset distribution pattern, may include data of the predefined set of voltage offsets. For instance, for an image sensor with a number of n ADCs, each analog-to-digital converter has an individual voltage offset, therefore, a predefined set of voltage offsets has a unique voltage offset distribution pattern.

In such a case, the fingerprint may be a sequence of n numbers (corresponding to the number n of ADCs), which may be based on the voltage offsets of the predefined set of voltage offsets.

For example, when an image sensor has a plurality of pixels and has a number of n analog-to-digital converters, the voltage offsets of all n ADCs can be determined or calculated (an exemplary method for calculation of the voltage offsets will be described below) and a fingerprint for the image sensor can be determined.

Assuming that, a predefined set of voltage offsets including all n ADCs is selected. A possible fingerprint for such an exemplary image sensor can be a function containing the voltage offsets of all ADCs, and can be written as:

$$F_{image\ sensor}=(V_1, V_2, V_3, \ldots, V_{n-2}, V_{n-1}, V_n) \quad (1)$$

In the above equation (1), the $F_{image\ sensor}$ is the fingerprint of the image sensor and $V_1$, $V_2$ and $V_n$, are the voltage offsets of the first analog-to-digital converter, the second analog-to-digital converter and the $n^{th}$ analog-to-digital converter, respectively, wherein in this case the fingerprint and the set of voltage offsets are identical to each other without that the present disclosure is limited in that regard. Moreover, $V_1$, $V_2$ and $V_n$, have a random value in the range of, for example, −60 mV and +60 mV, as discussed above (without limiting the present disclosure in that regard).

The number n may be any integer number. Further below, without limiting the present disclosure in that regard, in an exemplary case, the number of ADCs is 320.

However, the method is not limited to obtain the voltage offsets of all ADCs, but, in principle, any predefined set of voltage offsets can be selected.

As discussed above, the fingerprint is unique, which means in some embodiments, that the likelihood that another device has the same voltage offset distribution pattern is highly unlikely. For example, based on typical measurement accuracy, a theoretical maximum amount of different samples or voltage offset distribution patterns for an exemplary image sensor having a number of 320 ADCs (i.e. n=320) is in the order of $10^{80}$ (100 Quinvigintillion). In this exemplary case, the probability for having two identical fingerprints (or voltage offset distribution patterns) for two different image sensors each having a number of 320 ADCs is 1 over the nearly infinite ($10^{80}$) number of samples, when the voltage offsets of all 320 ADCs is taken into account. Therefore, in some embodiments, the determined fingerprint of a device may be used for identifying the device, as discussed above.

Moreover, the fingerprint of the device may remain unique for the lifetime of the device.

In some embodiments, the fingerprint of the device may be used to identify the device, e.g. by analyzing the shape, size, and the like, of at least two voltage offset distribution patterns, whereby the corresponding fingerprints may be distinguished from each other. Moreover, the device may be tracked based on its fingerprint.

In some embodiments, a device can be identified based on the (unique) fingerprint without the need of an integrated memory, since the set of voltage offsets is used for providing the fingerprint, wherein the set of voltage offsets naturally exists. Therefore, the size of the device may be reduced compared to prior art solutions, power consumption may be reduced, and it may be manufactured and may operate with a lower cost. Moreover, the device may be precisely identified based on the fingerprint, as will also be discussed further below.

In some embodiments, the voltage offset distribution pattern is random, as discussed above, and, as mentioned, the voltage offset of the plurality of analog-to-digital converters are random. Hence, the voltage offset distribution pattern of each device is a random pattern. For instance, a location and magnitude of the voltage offsets is randomly distributed over the plurality of ADCs.

As mentioned, in some embodiments, the random voltage offset distribution pattern may be unique for the device.

As mentioned, the voltage offsets of the plurality of analog-to-digital converters are unique values which may depend on the device itself, its processing, its design, its production, etc. Therefore, the random voltage offset distribution pattern of a predefined set of voltage offsets may also be unique for the device. For example, location and magnitude of each voltage offset of the predefined set of voltage offsets may be unique and may be individual to the device.

In some embodiments, the device may be a semiconductor chip including the plurality of analog-to-digital converters (ADCs), as discussed above, wherein the device may further include a plurality of analog-to-digital converters. The present disclosure is not limited to a specific configuration of the semiconductor chip or the ADC arrangement.

As discussed, in some embodiments the semiconductor chip may be an image sensor including a plurality of pixels, wherein each of the plurality of pixels includes at least one of the plurality of analog-to-digital converters. The device may further include a plurality of analog-to-digital converters. For example, in an image sensor, any pixel configuration having ADCs that provide analog signals related to the intensity of light impinging on the pixels may be used.

In some embodiments, the image sensor may include an active pixel area and a non-active pixel area. Moreover, the active pixel area may include pixels that are used for providing an image and the non-active pixel area may include pixels that do not belong to the active pixel area, and are not used to provide the image. The non-active pixel area may include a column of pixels which are used, for example, as a test row.

Moreover, the non-active pixel area of the image sensor may be the first column of the pixel area, the last column of the pixel area, any other structure which allows test access to the plurality of ADCs, etc.

In some embodiment, the plurality of analog-to-digital converters which corresponds to the non-active pixels of the image sensor may be used, and a fingerprint may be provided for the image sensor.

In some embodiments, the plurality of analog-to-digital converters corresponds to a plurality of pixels of the image sensor.

In some embodiments, each pixel may include an analog-to-digital converter, hence, the number of analog-to-digital converters corresponds to the number of the pixels of the image sensor.

In some embodiments, a plurality of pixels, for example, a column of pixels, a row of pixels, a pixel area, a block of pixels, a predefined region of pixels, etc. is associated to one or more analog-to-digital converter(s). For example, a column of pixels may be connected to an analog-to-digital converter, a row of pixels may be connected to an analog-to-digital converter, or the like.

Hence, some embodiments provide a fingerprint for the image sensor and it may not impact the performance of the image sensor (e.g. for providing the image), i.e., the fingerprint is provided from the non-active pixels of the image sensor. For instance, the active pixel area is used for providing the image and the non-active pixels are used as a test row, e.g. for providing the fingerprint of the image sensor. Therefore, the fingerprint may not be associated with the active pixel area and, it may not impact the performance of the image sensor for providing the image, or the like. Moreover, in some embodiments, the fingerprint may be provided at a time different than providing the image, and it may not impact the performance of the image sensor, or the like.

In some embodiments, the image sensor may be a time-of-flight sensor including the plurality of analog-to-digital converters.

The time of flight sensor may be a direct time-of-flight imager, an RF-modulated light source, a range gated imager sensor, etc. The present disclosure is not limited to a particular type of time-of-flight (ToF) sensor, any ToF sensor that has a plurality of analog-to-digital converters can be used, as discussed above.

As discussed, in some embodiments, the voltage offsets of ADCs may be distributed within a value range of −60 mV and +60 mV.

Some embodiments pertain to a method including determining a fingerprint for a device including a plurality of analog-to-digital converters, based on a voltage offset distribution pattern of a predefined set of voltage offsets provided by the plurality of analog-to-digital converters, as also discussed above.

In some embodiments, the method may further include storing the determined fingerprint in a database. The database may be stored on an internal or external memory (RAM, ROM, or the like), on a server, in the cloud, on a personal computer, it may be located on the device having the ADCs, it may be distributed between two or more devices, it may be on a remote computer, etc. The stored fingerprints in the database may further be used, for example, for identifying the device, tracking the device, obtaining information about the manufacturing company and the retailer, etc.

In some embodiments, the fingerprint may be represented by the predefined set of voltage offsets, as discussed above. For example, the predefined set of voltage offsets of the plurality of ADCs may be used and the fingerprint of the device may be determined based on the voltage offset distribution pattern.

As discussed above, determining the fingerprint for the device may include determining the voltage offsets of the plurality of ADCs. Moreover, a method referred to and known as Resistor Ladder Test Row may be used for estimation or measuring of the voltage offsets, which is based on applying (forcing) two input voltages to the plurality of ADCs and measuring/reading out the voltage offsets of the plurality of ADCs.

In some embodiments, an internal connecting node may be used which can be connected to a supply voltage (VDD). Moreover, the internal connecting node may be placed, for example, at the beginning of the resistor ladder and at the end of the resistor ladder. Furthermore, an equal supply voltage may be applied to the beginning of the resistor ladder and to the end of the resistor ladder. Therefore, two inputs of each analog-to-digital converter may receive an equal input voltage. The output voltage of each analog-to-digital converter under this condition is the voltage offset of the analog-to-digital converter.

Hence, the output voltages of the plurality of ADCs may be measured and the voltage offsets of the plurality of ADCs may be determined.

As mentioned, in some embodiments, the Resistor Ladder Test Row may be used, and the voltage offsets of the plurality of ADCs may be estimated/measured, and a fingerprint for the device may be determined based on the voltage offset distribution pattern of a predefined set of voltage offsets. The present disclosure is not limited to the determination of the voltage offsets and the fingerprint of the device by using the Resistor Ladder Test Row, but any method that provides the voltage offsets of the plurality of ADCs may be used.

In some embodiments, a plurality of techniques may be applied in combination to determine the voltage offsets of the plurality of ADCs.

The method may be performed by an apparatus including the device having the plurality of ADCs as discussed herein, by a processor, circuitry, computer, tablet computer, server, remote server, smartphone, or the like.

In some embodiments, the device for which the fingerprint is determined, may be incorporated in another device, an apparatus, a circuitry having a processor or the like. The method for determining the fingerprint of the device may be performed by the device itself, by the entity (device, apparatus, circuitry, etc.) in which it is incorporated or by an external device, e.g. a personal computer, a tablet computer, a server device-computer, or the like.

In some embodiments, for example, the semiconductor device including the plurality of ADCs, may be incorporated in another electronic device which may further be able to connect to a circuitry having a processor to execute the method for determining the fingerprint of the device, e.g., in a personal computer, a tablet computer, a server device-computer, or the like.

As discussed above, a fingerprint may be determined, for a device including a plurality of analog-to-digital converters, based on a voltage offset distribution pattern of a predefined set of voltage offsets provided by the plurality of analog-to-digital converters. The determined fingerprint may be individual or unique for the device, as discussed above. Thus, it might be possible to identify the device based on the determined fingerprint.

In some embodiments, the method further includes receiving a known fingerprint from a database, wherein the known fingerprint is based on a voltage offset distribution pattern of a predefined set of voltage offsets provided by a plurality of analog-to-digital converters of a device. As mentioned, the known fingerprint may be stored in a database and the method may further receive the known fingerprint which belongs to a known device from the database.

In some embodiments, the method may further include identifying the device, for which the fingerprint has been determined, as also discussed above.

In some embodiments, the device including the plurality of ADCs may be identified. Hence, the method may further include identifying the device, based on a correlation of the determined fingerprint and the known fingerprint. The known fingerprint may be obtained from the stored fingerprints in the database, as discussed above. The correlation between the determined fingerprint and the known fingerprint may be performed by correlating the voltage offsets of the set of voltage offsets of the determined fingerprint with the voltage offsets of the set of voltage offsets of the known fingerprint. Although it is expected that, for example, the set of voltage offsets of the same device may differ when they are determined at different points of time, e.g., due to different environmental conditions, different lifetimes and/or life cycles, different testing or measurement conditions, etc., it is assumed that the influence thereof does not destroy the voltage offset distribution pattern itself. Hence, it is expected that in cases where the determined fingerprint and the known fingerprint stem from the same device, the two sets of voltage offsets will have a high correlation and if they stem from different devices, they will have a low correlation.

In some embodiments, the correlation may be based on a statistical model, e.g., a linear regression model, or the like, without limiting the present disclosure in that regard. A linear regression model is suitable, since it is assumed that the determined and known fingerprints, i.e. the set of voltage offsets for the determined and for the known fingerprint will have, from a statistical point of view, a linear relationship to each other, while the set of voltage offsets of two different devices are expected to not have a linear relationship. Hence, by applying a linear regression model to the correlated (first and second) set of voltage offsets of the determined (first) fingerprint and the known (second) fingerprint, the quality of the linear relationship between the first and second set of voltage offsets can be determined. Moreover, in some embodiments, the linear relationship between a first and second voltage offset of the same device is expected to not be destroyed, when the first and second voltage offsets are determined under different conditions, e.g. different environmental conditions (temperature, pressure, humidity, etc.), different lifetimes and/or life cycles, different setups for determination, etc., since it is expected that such influences result in a very similar effect to all ADCs, such that the unique voltage offset distribution pattern forming the fingerprint is not destroyed, even if, for example, the absolute values of the voltage offsets are changed. In some embodiments, at least one parameter of the linear regression model may be calculated. For instance, the linear regression model may be used, the determined fingerprint and the known fingerprint may be correlated, and the method may further include determining at least one of R-square, slope, intercept, maximum residual error, minimum residual error and root mean square error for the linear regression model. The calculated parameters may further be used to validate the model and, consequently, the device may be identified. Such parameters of the linear regression model may be indicative of the quality of the fitting of a line to the correlated voltage offsets, such that they are indicative of the probability that the set of voltage offsets stem from the same device or from different devices.

In some embodiments, the method may further include determining a linear relationship between the voltage offset distribution pattern of the predefined set of voltage offsets of the known fingerprint and the voltage offset distribution pattern of the predefined set of voltage offsets of the determined fingerprint, as discussed above.

As mentioned, in some embodiments, a device may be identified based on a correlation of the determined fingerprint and the known fingerprint. The method may further include storing the determined fingerprint as a fingerprint for a new device in the database, when the device is not identified, for instance, since the correlation between the determined fingerprint and the known fingerprint, i.e. the set of voltage offsets, is too small.

For example, if the linear regression model is used and the parameters of the linear regression model are determined with the result that an insufficient linear relationship is determined between the determined fingerprint (of the device that is to be identified) and the known fingerprints in the database, the device is not identified based on the known fingerprints in the database. In such a case, the determined fingerprint may be stored in the database as a fingerprint for a new device.

As discussed above, a correlation of the determined fingerprint and the known fingerprint may be applied. In some embodiments, the method may further include identifying the device when a correlation evaluation score is larger than a predetermined value, as also indicated above. For example, as discussed, a linear regression model may be used, the determined fingerprint and the known fingerprint may be correlated, and when a R-square value is greater than or equal to 0.9 ($R^2 \geq 90\%$), in such a case, the determined fingerprint and the known fingerprint are determined to have a linear relationship. Hence, the determined fingerprint and the known fingerprint may belong to an identical device. Note that, the R-square value may vary between −1.0 to 1.0 (or −100% to 100%).

In some embodiments, the identifying includes estimating an error for the linear regression model. For example, at least one of maximum residual error, minimum residual error and root mean square error may be estimated for the linear regression model.

In some embodiments, the device may be identified, when the error is lower than a predetermined error threshold value. For instance, as discussed, a linear regression model may be used, the determined fingerprint and the known fingerprint may be correlated, and a maximum residual error is estimated or calculated to be less than or equal to maximum noise error (Max $\varepsilon_i \leq 3\sigma$). In such a case, the determined fingerprint and the known fingerprint are determined to have a linear relationship. Moreover, it may be determined that the determined fingerprint and the known fingerprint may belong to an identical device. Furthermore, in some embodiments, a root mean square error may be estimated or calculated and the device may be identified. For example, a linear regression model may be used, the determined fingerprint and the known fingerprint may be correlated, and the root mean square error is estimated or calculated to be less than or equal to root mean square of noise level (RMSE≤σ). In such a case, the determined fingerprint and the known fingerprint may be determined to have a linear relationship. Moreover, it may be determined that the determined fingerprint and the known fingerprint may belong to an identical device.

In some embodiments a minimum residual error may be estimated and the device may be identified. For example, as discussed, a linear regression model may be used, the determined fingerprint and the known fingerprint may be correlated, and the minimum residual error is estimated or calculated to be greater than or equal to minimum noise level (Min $\varepsilon_i \geq -3\sigma$). In such a case, the determined fingerprint and the known fingerprint are determined to have a linear relationship. Moreover, it may be determined that the determined fingerprint and the known fingerprint may belong to an identical device.

Assuming, in some embodiments, that the fingerprint of the device is based on the voltage offset distribution pattern of the predefined set of voltage offsets, as discussed above. In such embodiments, any changes in the voltage offsets of the plurality of ADCs may be automatically considered in the method. The parameters of the linear regression model such as slope, intercept, root mean square, root mean square error, etc., may be calculated by any suitable method known by a skilled person. For example, the root mean square error may be estimated by calculating the residuals which are the deviation of the voltage offset values from the corresponding values of a regression line in the linear regression equation. The residuals may be positive or negative, then, by squaring the residuals, a root mean square error may be calculated, as known to the skilled person.

For example, any changes in the voltage offsets of the plurality of ADCs due to, e.g., device temperature, aging of the device, and the like, is automatically considered in the method for determining a fingerprint for the device and identifying the device, as also discussed above. Therefore, the method may be independent of temperature, aging, and the like.

In exemplary studies, the method has been applied for determining a fingerprint for a device including 320 numbers of ADCs and identifying the device based on the determined fingerprint. The validity of the method has been exemplary confirmed when the device has undergone a 504 hours of high temperature operating life (HTOL), which is equivalent to a 10 years lifetime.

The methods as described herein are also implemented in some embodiments as a computer program causing a computer and/or a processor to perform the method, when being carried out on the computer and/or processor. In some embodiments, also a non-transitory computer-readable recording medium is provided that stores therein a computer program product, which, when executed by a processor, such as the processor described above, causes the methods described herein to be performed.

Hereinafter, preferred embodiments of the present disclosure will be described in detail with reference to the appended drawings. Note that, in this specification and the appended drawings, structural elements that have substantially the same function and structure are denoted with the same reference numerals, and repeated explanation of these structural elements is omitted.

Returning back to FIG. 1, an embodiment of a device in the form of a semiconductor chip 10 is illustrated. The semiconductor chip 10 has a plurality of pixels 11, a plurality of analog-to-digital converters 12, a plurality of analog signal multiplexers 13, a row decoder 14, and a scanner (multiplexer) 15 to provide the digital output.

The semiconductor device 10 is manufactured on a single integrated circuit, but could also be manufactured and assembled in separate component pieces. Without limiting the disclosure, the following embodiments are exemplarily discussed on the basis of an exemplary image sensor.

The plurality of pixels 11 are arranged in a two-dimensional array, wherein each pixel column is connected to an analog-to-digital converter 12 via analog signal multiplexers 13.

Generally, there is no restriction on the arrangement of the pixels, any pixel configuration having ADCs that provide analog signals can be used, as discussed above.

In this embodiment, each pixel 11 of the plurality of pixels has an incorporated analog-to-digital converter 16.

Figure 2:
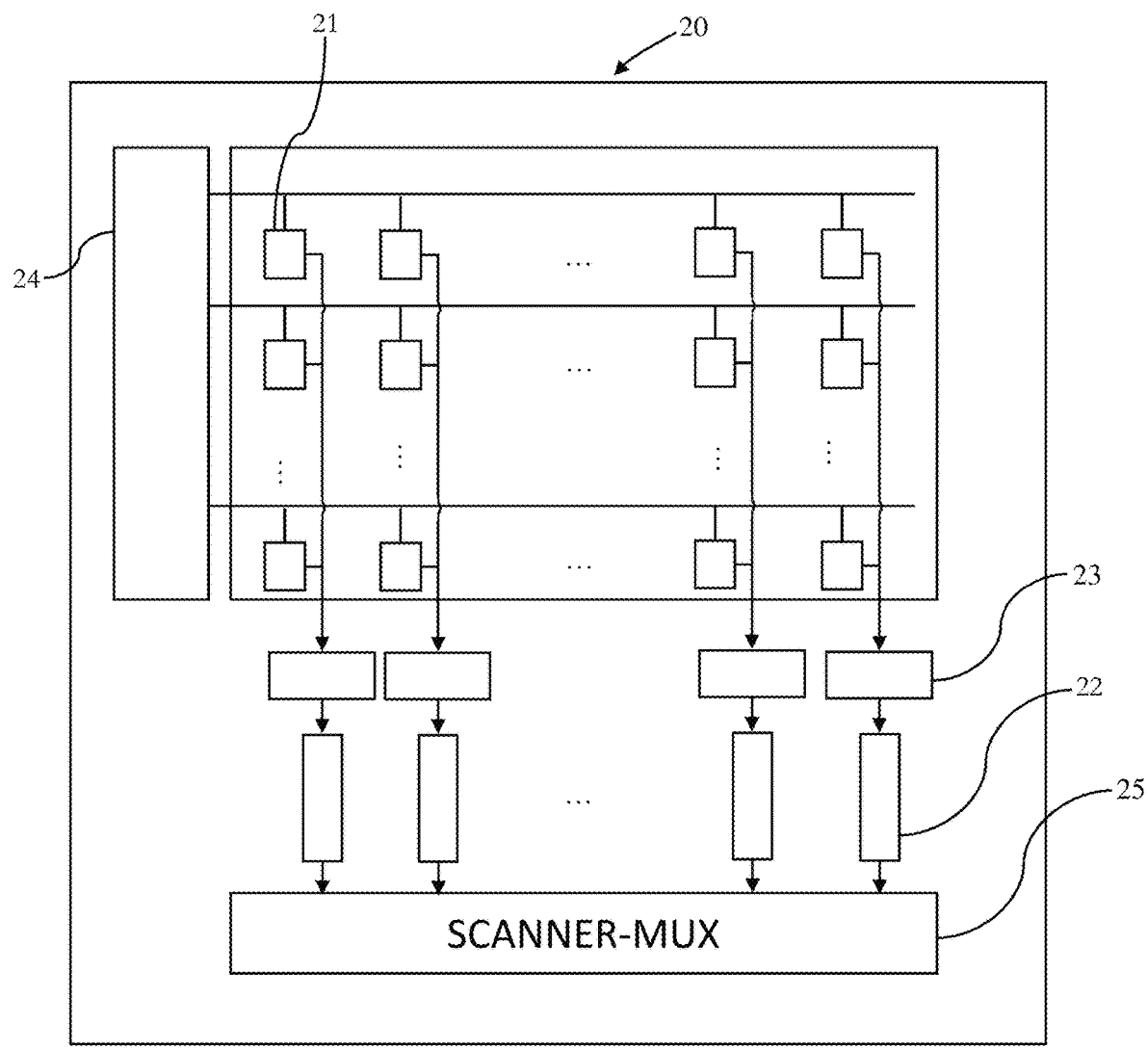
FIG. 2 illustrates an embodiment of an image sensor, which has a plurality of analog-to-digital converters.

FIG. 2 is a schematic diagram of the device in the form of an image sensor 20 according to an embodiment of the present disclosure, where ADCs 22 are provided for each pixel column, as will be discussed further below.

The image sensor 20 has a plurality of pixels 21, a plurality of analog-to-digital converters 22, a plurality of analog signal multiplexers 23, a row decoder 24, and a scanner (multiplexer) 25 to provide the digital output.

The plurality of pixels 21 is arranged in a two-dimensional array. Each pixel column is connected to an analog-to-digital converter 22 via corresponding analog signal multiplexers 23. There is no restriction on the arrangement of the pixels, the plurality of ADCs, etc., as discussed above. The image sensor 20 is manufactured by a Complementary Metal-Oxide-Semiconductor (CMOS) process, for example, on a single integrated circuit chip, or it could also be manufactured and assembled in separate component pieces, as discussed above.

The plurality of pixels 21, in the image sensor 20, is configured to generate photoelectrons proportional to the magnitude of light impinging on them.

As depicted in FIG. 2, the plurality of pixels arranged in one column outputs an analog signal corresponding to the generated photoelectrons, and provides the analog signal to corresponding multiplexers 23.

The multiplexers 23 are connected to the plurality of ADCs 22. The plurality of ADCs 22 sample a corresponding input analog signal, convert it to a digital signal, and provide it to the scanner/mux 25, as discussed above, i.e. each ADC of the plurality of ADCs 22 receives an associated analog signal of the pixel column to which it is connected, converts the analog signal to a digital signal and outputs the digital signal.

As a result, an analog signal (or analog signals) from the plurality of pixels 21 is sent to a corresponding analog signal multiplexer 23 and further distributed to a corresponding analog-to-digital converter 22.

In some embodiments, the image sensor may further be configured to compress the output digital signal, for example, by a compress sensing, to achieve low power consumption, etc.

The image sensor may be used in digital imaging devices, e.g. in a digital camera, in a smartphone, in a tablet computer, or the like, as discussed above.

Figure 3:
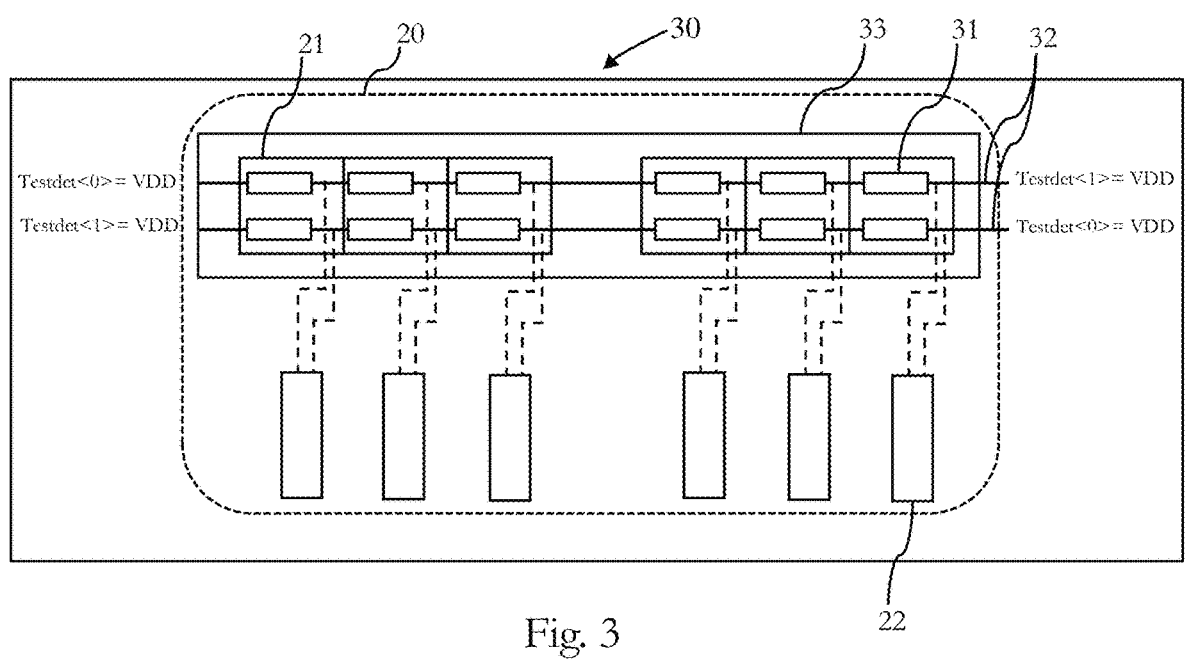
FIG. 3 illustrates an embodiment of an apparatus for measuring voltage offsets of a plurality of analog-to-digital converters of an image sensor.

FIG. 3 illustrates an embodiment of an apparatus in the form of an implemented experimental set-up 30 for measuring voltage offsets of a plurality of analog-to-digital converters 22 of an image sensor 20 in accordance with the present disclosure and as discussed above under reference of FIG. 2.

As discussed above, the image sensor 20 includes a plurality of pixels 21, and each pixels' column is connected to an analog-to-digital converter 22.

In the present embodiment, the plurality of pixels 21 is located in the first row of the image sensor 20 and is located in the non-active pixel area of the image sensor.

Moreover, the non-active pixel area includes pixels that do not belong to the active pixel area and are not used for providing the image, as discussed above. Furthermore, since the plurality of pixels 21 is located in the test row (non-active pixel area), the implemented experimental set-up 30 may not impact the performance of the image sensor 20, as discussed above.

Note, the present disclosure is not limited to using the first row pixels of the image sensor, but any test row which allows a test access to the plurality of ADCs may be used, as discussed above. For example, the first column of the pixel area, the last column of the pixel area, any other structure which allows test access to the plurality of ADCs, etc., may be used and a fingerprint for the image sensor 20 may be provided.

The experimental set-up 30 uses a method referred to and known as Resistor Ladder Test Row 33, which uses a plurality of resistors 31 connected in series to each other, for estimation or measurements of the voltage offsets of the plurality of the ADCs 22. The Resistor Ladder Test Row 33 method implemented in the experimental set-up 30 is based on applying two input voltages (VDD) to the plurality of ADCs 22 and measuring/reading out the voltage offsets of the plurality of ADCs 22.

Moreover, a plurality of internal connecting nodes 32 are used which are connected to a supply voltage (VDD). In the present embodiment, the internal connecting nodes 32 are placed at the beginning of the resistor ladder and at the end of the resistor ladder.

Furthermore, an equal supply voltage (VDD) is applied to the beginning of the resistor ladder and to the end of the resistor ladder (i.e. to Testdet<0> and Testdet<1>). Therefore, two inputs of each analog-to-digital converter 22 receive an equal input of voltages. The output voltage of each analog-to-digital converter under this condition is the voltage offset of analog-to-digital converter. Hence, the output voltages of the plurality of the ADCs 22 may be measured and the voltage offsets of the plurality of the ADCs 22 may be determined, as discussed above.

Note that the determination of the voltage offsets is not limited to using the Resistor Ladder Test Row and that any method or a combination of methods that provide the voltage offsets of the plurality of ADCs may be used, as discussed above.

Figure 4:
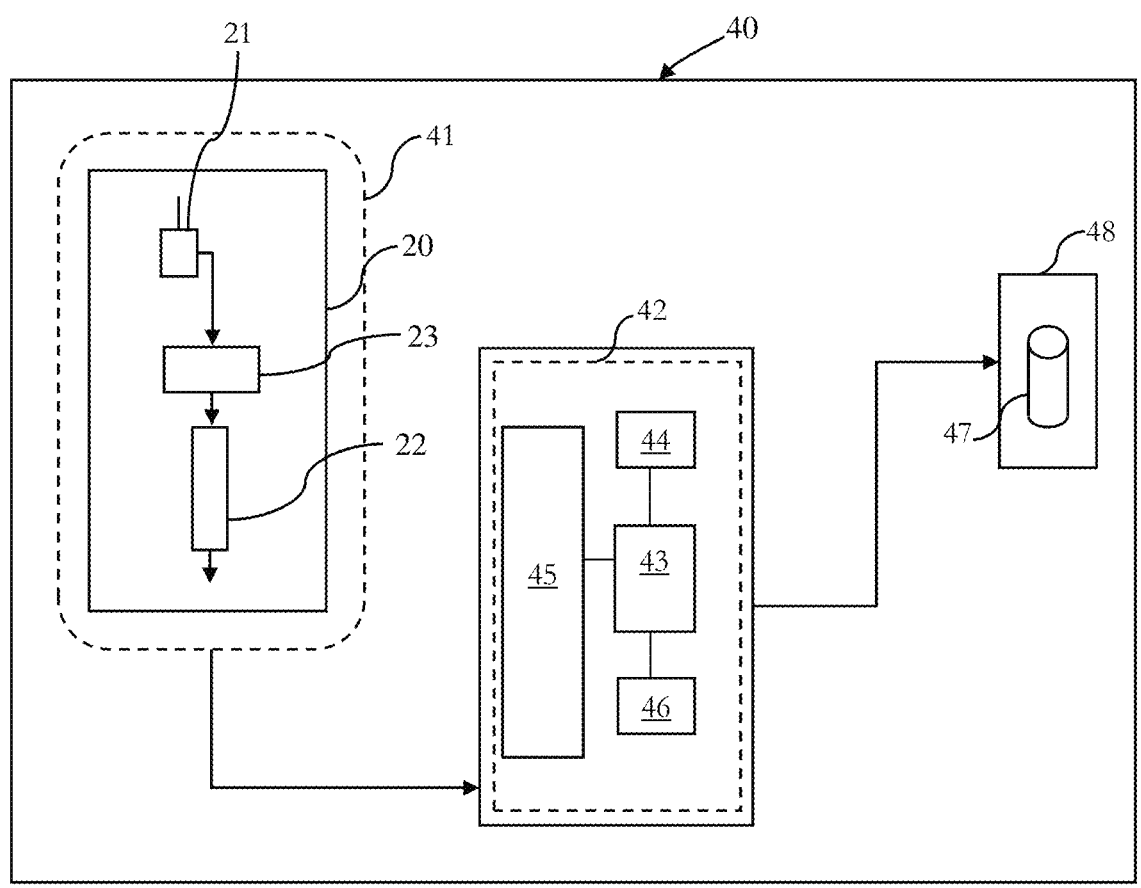
FIG. 4 illustrates an embodiment of an apparatus for determining a fingerprint for an image sensor.

FIG. 4 illustrates an embodiment of an apparatus 40 for determining a fingerprint for an image sensor 20 in accordance with the present disclosure.

The apparatus 40 has a test station 41 which is used for calculation of voltage offsets of the image sensor 20. As discussed under reference of FIG. 2 above, the image sensor 20 in the test station 41 has a plurality of pixels 21, a plurality of analog-to-digital converters 22, and a plurality of analog signal multiplexers 23.

The test station 41 is configured to calculate the voltage offsets of the plurality of ADCs 22 of the image sensor 20, for example, by implementing the Resistor Ladder Test Row, as described above under reference of FIG. 3. The test station 41 is not limited to the Resistor Ladder Test Row method, any other method that is intended for calculating the voltage offsets of the plurality of ADCs 22 of the image sensor 20, can be used.

The voltage offsets of the plurality of ADCs 22 calculated (determined) by the test station 41 will be provided to a circuitry 42 in the apparatus 40 for determining a fingerprint for the image sensor 20.

The circuitry 42 has a processor 43 (including one or more processors), a random access memory 44, an interface 45, and a storage 46, wherein the storage 46 is a hard disk in this embodiment, without limiting the disclosure in that regard.

The interface 45 is configured to perform communication over wire and wirelessly (Bluetooth and wireless local area network), such that it can communicate with the test station 41 to obtain the calculated voltage offsets of the plurality of ADCs 22 of the image sensor 20. The interface may further be able to communicate with other electronic devices over internet, a network, a stored database in the cloud, etc.

The processor 43 is configured to run a program for determining the fingerprint of the image sensor 20, as discussed above, and it may be configured to perform the method as also discussed above and further below.

The circuitry 42 obtains the calculated voltage offsets of the plurality of ADCs 22 of the image sensor 20 through its interface 45, and provides the voltage offsets to the processor 43. The processor 43 selects a predefined set of voltage offsets of the plurality of ADCs 22 of the image sensor 20 provided from the test station 41. In the present case, the predefined set of voltage offsets includes all voltage offsets of all ADCs 22.

The processor 43 further determines a fingerprint for the image sensor 20 based on a voltage offset distribution pattern which is formed by the voltage offsets of the set of voltage offsets, wherein the determined fingerprint is represented by the predefined set of voltage offsets, as described above.

The circuitry 42 is further configured to store the determined fingerprint in a database 47. In this embodiment, the database 47 is located in the cloud 48, i.e., e.g., on a storage of a remote computer/server connected via the internet. The circuitry 42 is able to communicate with its interface 45 to provide the determined fingerprints. The present disclosure is not limited to a specific location of the database, and the database may be stored, e.g., in the circuitry, in a memory, in a hard disk, on a server, etc.

Moreover, the processor 43 in the circuitry 42 is configured to run a program (performing the method) and identify the determined fingerprint based on known fingerprints in the database 47, as discussed above and as will be discussed further below.

For example, the circuitry 42 communicates over its interface 45 with the test station 41, which was used for calculation of the voltage offsets. Next, the circuitry 42 obtains the voltage offsets and the processor 43 determines a fingerprint for the image sensor 20, as discussed above.

Furthermore, the processor 43 of the circuitry 42 runs a program (performing the method) to identify the determined fingerprint. The circuitry 42 communicates with its interface 45 and obtains known fingerprints from the database 47. Next, the processor 43 determines, e.g., based on a statistical model such as a linear regression model, if there is a linear relationship between the determined fingerprint and the known fingerprint. The processor 43 may further be configured to identify the determined fingerprint based on the correlation of the determined fingerprint with the known fingerprint(s). A more detailed description of a statistical model based on a linear regression model will be given further below.

In the following, an embodiment of a method 50 for determining a fingerprint for a device, such as the device of FIG. 1 or 2, is discussed under reference of FIG. 5, which is performed by the processor 43 of the circuitry 42 of the apparatus 40 of FIG. 4.

At 51, the circuitry 42 receives voltage offsets data, in the present example, the voltage offsets of the plurality of ADCs 22 of the image sensor 20, which are calculated, for example, in the test station 41 and which are provided to the circuitry 42 via its interface 45, as discussed above.

At 52, the processor 43 of the circuitry 42 selects a predefined set of voltage offsets. The predefined set of voltage offsets are selected from the provided voltage offsets that have been calculated in the test station 41, as discussed above, i.e. the set of voltage offsets should include voltage offsets for all ADCs of the plurality of ADCs in this example.

At 53, the processor 43 generates a voltage offset distribution pattern. The processor 43 in the circuitry 42 generates the voltage offset distribution pattern based on the voltage offsets included in the predefined set of voltage offsets, as discussed above.

At 54, the processor 43 of the circuitry 42 determines a fingerprint for the image sensor 20. The fingerprint is determined based on the voltage offset distribution pattern, as discussed above.

At 55, the circuitry 42 stores the determined fingerprint in a database 47, as discussed above, for example, by communicating, e.g. wirelessly, through its interface 45 and providing the determined fingerprint. The fingerprints may be stored, for example, in the database 47 which is located in the cloud 48, as discussed above.

Figure 6:
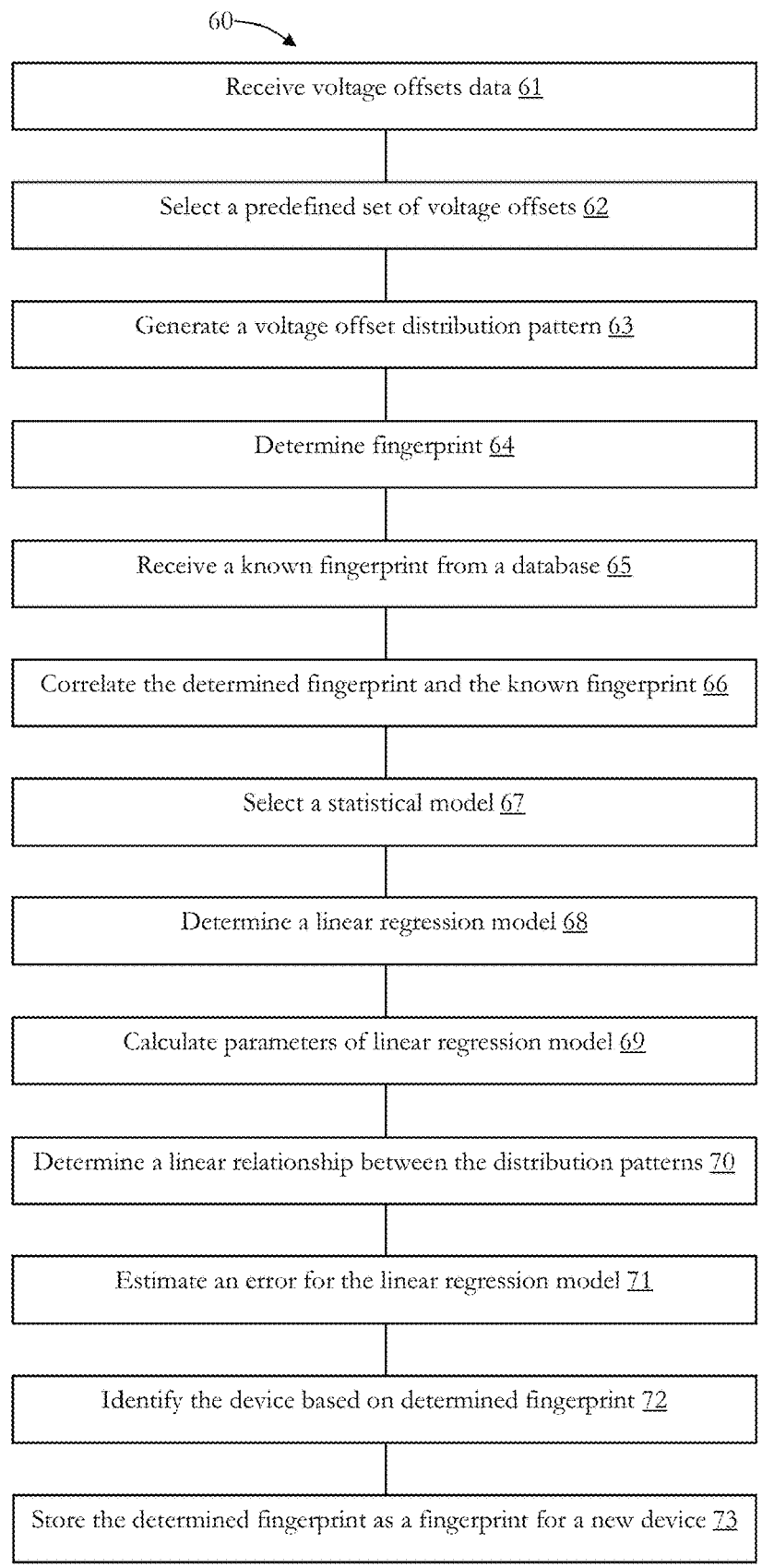
FIG. 6 is a flowchart of an embodiment of a method for determining a fingerprint for a device and identifying the device.

In the following, an embodiment of a method 60 for determining a fingerprint for a device and identifying the device is discussed under reference of FIG. 6, wherein the method 60 is performed by the processor 43 of the circuitry 42.

The method 60 determines a fingerprint for an exemplary image sensor, such as sensor 20 of FIG. 2, and then identifies the image sensor 20 based on the determined fingerprint, as will be discussed in the following.

At 61, the circuitry 42 receives voltage offsets data representing the voltage offsets of the plurality of ADCs 22 of the image sensor 20, which are calculated in the test station 41 and are provided to the circuitry 42 via its interface 45, as discussed above.

At 62, the processor 43 of the circuitry 42 determines a predefined set of voltage offsets based on the provided voltage offsets that have been calculated in the test station 41, as discussed above. Typically, the predefined set of voltage offsets includes all voltage offsets of all ADCs 22.

At 63, the processor 43 generates a voltage offset distribution pattern, based on the voltage offsets included in the predefined set of voltage offsets, as discussed above.

At 64, the processor 43 determines a fingerprint for the image sensor 20, based on the voltage offset distribution pattern, as discussed above.

At 65, the circuitry 42 receives a known fingerprint from, e.g., a database 47 which is located in the cloud 48. The circuitry 42 may receive the known fingerprint via wireless communication with its interface 45, as discussed above. In this example, the known fingerprint is also determined based on a voltage offset distribution pattern, in this case of a known device.

At 66, the processor 43 in the circuitry 42 correlates the determined fingerprint and the known fingerprint. Both the determined fingerprint and the known fingerprints are based on voltage offset distribution patterns. The processor 42 may correlate the determined fingerprint with the known fingerprint, as discussed above and as will be discussed in more detail further below.

Optionally, at 67, the processor 43 may select a statistical model, e.g., among a plurality of predefined statistical models, or it may select a predefined statistical model such as the linear regression model, for correlation of the determined fingerprint and the known fingerprint.

In other embodiments, the statistical model to be used is prescribed and predefined, for example, in a program which is executed by the processor 43.

At 68, the processor 43 determines a linear regression model, in order to determine a linear relationship between the determined fingerprint and the known fingerprint, as discussed above. The determination of the linear regression model may be based on correlation of the voltage offset distribution pattern of the determined fingerprint with the voltage offset distribution pattern of the known fingerprint, based on the linear regression equation, as discussed above.

At 69, the processor 43 calculates parameters of the linear regression model. For instance, the determined fingerprint and the known fingerprint are correlated based on the linear regression model, as discussed above. Then, the processor 43 calculates at least one parameter of the linear regression model, wherein in this embodiment the different parameters that are determined are R-square, slope, intercept, maximum residual error, minimum residual error and root mean square error for the linear regression model. The calculated parameters may further be used to validate the model and, consequently, the device may be identified, as will be apparent from the discussion further below. The parameters of the linear regression model (e.g., slope, intercept, etc.) may be calculated by any suitable known method to the skilled person.

At 70, the processor 43 determines if a linear relationship is formed between the voltage offset distribution pattern of the determined fingerprint and the voltage offset distribution pattern of the known fingerprint. The determination of the linear relationship is based on the calculated parameters of the linear regression model, as discussed above. For example in the case that a R-square value is greater than or equal to 0.9 ($R^2 \geq 0.9$), the determined fingerprint and the known fingerprint are considered, or assumed, to have a linear relationship with another. Moreover, in the case that the slope value is in the range of 1.00±0.02 (($\beta \approx 1.00 \pm 0.02$) and the intercept value is in the range of 0.00±0.02 ($\alpha \approx 0.00 \pm 0.02$), the determined fingerprint and the known fingerprint may also be considered to have a linear relationship with another, as will be discussed in more detail further below.

At 71, the processor 43 estimates an error for the linear regression model. The error may be estimated by any suitable known method to the skilled person, as discussed above.

At 72, the processor 43 identifies the device, based on the correlation of the determined fingerprint with a known fingerprint. For example, in the case that a R-square value is greater than or equal to 0.9 ($R^2 \geq 0.9$), in such a case, the determined fingerprint and the known fingerprint may be considered to belong to an identical device.

At 73, the processor 43 stores the determined fingerprint as a fingerprint for a new device, since no linear relationship was determined with any known fingerprint in the database

47, and, thus, the determined fingerprint is determined not to be identical to any known fingerprint in the database 47.

Figure 7:
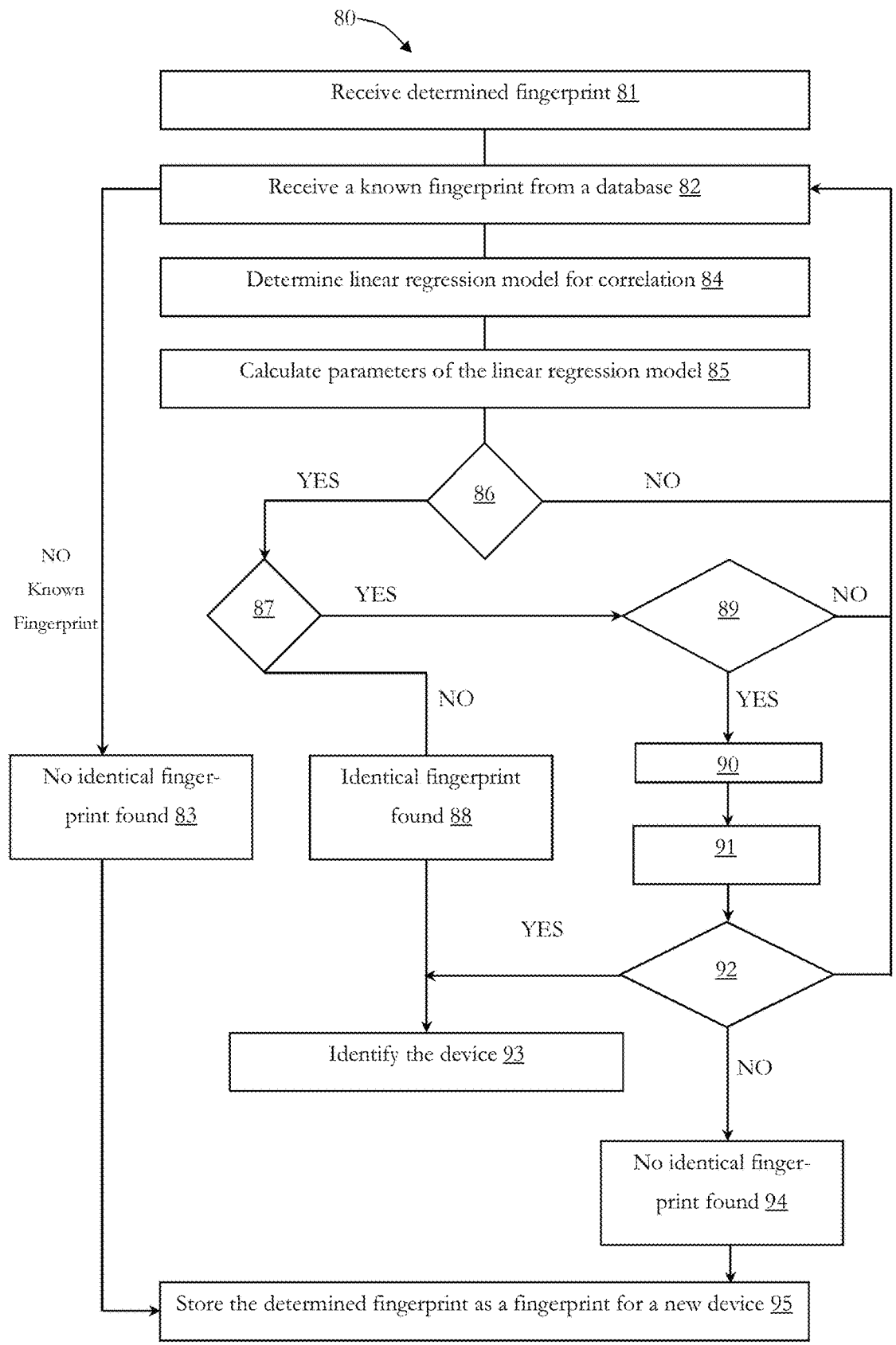
FIG. 7 is a flowchart of an embodiment of a method using a linear regression model.

In the following, a method 80 using the linear regression model for determining a linear relationship between the voltage offset distribution pattern of the determined fingerprint and the voltage offset distribution pattern of the known fingerprint is discussed under reference of FIG. 7, which may be performed, for example, by the processor 43 of the circuitry 42.

Figure 5:
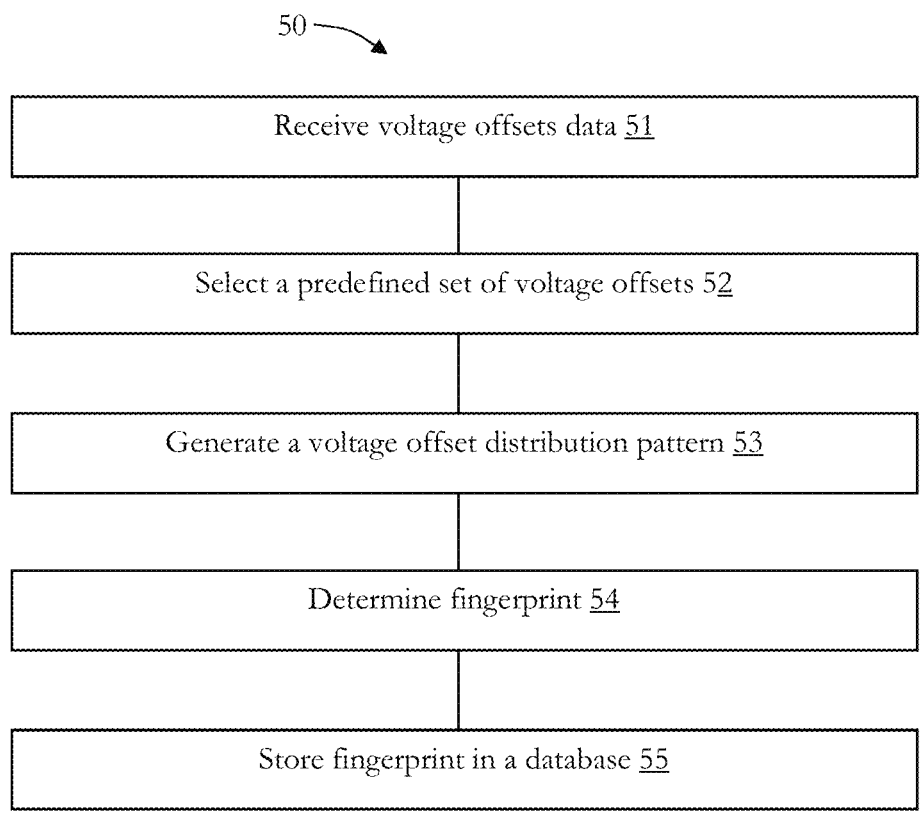
FIG. 5 is a flowchart of an embodiment of a method for determining a fingerprint for a device.

At 81, the circuitry 42 receives a determined fingerprint, which has been determined, e.g., as discussed under reference of FIG. 5. Moreover, the determined fingerprint belongs to a device that is to be identified. The circuitry 42 may receive the determined fingerprint via its interface 45 and may further provide it to the processor 43, as discussed above.

At 82, the circuitry 42 receives a known fingerprint, which is obtained from the database 47 and is based on a voltage offset distribution pattern of a known device which has a known identity. The circuitry 42 may receive the known fingerprint via its interface 45 and may further provide it to its processor 43, as discussed above.

At 83, if there is no known fingerprint stored in the database 47 (e.g., since the database 47 is empty), and therefore, no known fingerprint can be provided to the circuitry, the circuitry stores the determined fingerprint as a fingerprint for a new device, e.g., in the database 47, at 95.

At 84, the circuitry 42 determines a linear regression model in order to correlate the determined fingerprint to the known fingerprint.

A possible linear regression model for an image sensor with n numbers of ADCs is as follows:

$$y_i = \alpha + \beta x_i + \varepsilon_i, (i=1, \ldots, n) \qquad (2)$$

In the above equation (2), i is the number of the voltage offsets in the voltage offset distribution pattern, $\alpha$ is intercept, $\beta$ is slope, and $\varepsilon_i$ is an introduced error function to estimate the deviation from the model. Moreover, $y_i$ is the determined fingerprint and $x_i$ is the known fingerprint.

For example, an image sensor, such as the image sensor 20 of FIG. 2, that is to be identified (corresponding to the determined fingerprint) and the known image sensor (corresponding to the known fingerprint) have 320 numbers of ADCs, and the voltage offsets of all ADCs have been considered in the predefined sets of the voltage offsets, both the determined fingerprint and the known fingerprint are based on the voltage offset distribution pattern including 320 voltage offsets.

At 85, the circuitry 42 calculates the following parameters of the linear regression model: the determination coefficient corresponding to $R^2$ value in the linear regression equation, wherein the determination coefficient is the difference between expected variation and total variation, the slope ($\beta$), for the linear regression equation, and the intercept ($\alpha$), for the linear regression equation. The calculation of the parameters of the linear regression model (slope, intercept, etc.) may be performed by any suitable method known to the skilled person, as discussed above.

At 86, the circuitry 42 determines if a correlation evaluation score is larger than a predetermined value. For example, the circuitry may determine that the calculated R-square value (i.e. the correlation evaluation score in this embodiment) is greater than or equal to 0.9 ($R^2 \geq 0.9$). If the calculated R-square value is larger than 0.9, the circuitry may consider other R-square values at 87 (see further below), and if the calculated R-square value is not larger than 0.9, the circuitry may consider additional linear regression parameters, at 89 (see further).

If the R-square value is smaller than 0.9, it is assumed that the correlation between the determined and the known fingerprint is small, wherein if the R-square value is larger than 0.9, it is assumed that the correlation between the determined and the known fingerprint is large.

At 87 (R-square value is larger than 0.9), the circuitry 42 may determine if more than one close R-square value exist from the database 47. If there is more than one R-square value and if there is no closer R-square value than the R-square value for the current known fingerprint, the circuitry 42 may determine that the fingerprints are identical at 88, and if a closer R-square value exists, the circuitry may consider additional parameters of the linear regression model at 89.

At 88, the circuitry 42 determines that an identical fingerprint is found, e.g., only one R-square value exists which is larger than 0.9, and the device is determined to be identical with the device of the known fingerprint, i.e. it is identified at 93.

At 89 (more than one R-square value larger than 0.9), the circuitry 42 determines the slope and the intercept values, since it has to be determined which of the different known fingerprints having R-square values larger than 0.9 fit best to the determined fingerprint of the device to be identified.

Moreover, the circuitry 42 determines if the slope value is in the range of $1.00 \pm 0.02$ (($\beta \approx 1.00 \pm 0.02$) and if the intercept value is in the range of $0.00 \pm 0.02$ ($\alpha \approx 0.00 \pm 0.02$), since it is assumed that two fingerprints stemming from the same device will have a linear relationship having a slope of (nearly) one and an intercept value of (nearly) zero. In that case, the circuitry follows the 90 in order to determine additional parameters of the linear regression model and to validate the linear regression model.

However, if the slope value is not in the range of $1.00 \pm 0.02$ ($\beta \approx 1.00 \pm 0.02$) and the intercept value is not in the range of $0.00 \pm 0.02$ ($\alpha \approx 0.00 \pm 0.02$), the determined fingerprint and the known fingerprint are determined not to correspond to an identical device and the circuitry may receive another known fingerprint from the database, at 82.

At 90, the circuitry 42 calculates the errors for the linear regression model. In this embodiment, the circuitry 42 calculates the Root Mean Square Error (RMSE), the Maximum Residual Error of $\varepsilon_i$, and the Minimum Residual Error of $\varepsilon_i$, for the linear regression equation. The calculation of the parameters of the linear regression model may be performed by any suitable method known to the skilled person.

At 91, the circuitry 42 calculates a system noise level a for the linear regression equation. The calculation of the noise level may be performed by any suitable method known to the skilled person. The noise level may further be used for identification of the device corresponding to the determined fingerprint at 92 and 93.

At 92, the circuitry 42 determines if a maximum residual error is less than or equal to maximum noise error (Max $\varepsilon_i \leq 3\sigma$), and the root mean square error is less than or equal to root mean square of noise level (RMSE$\leq \sigma$), and the minimum residual error is greater than or equal to minimum noise level (Min $\varepsilon_i \geq -3\sigma$). If the mentioned conditions are met it is concluded that an identical fingerprint is found and the device is identified, at 93.

However, if the circuitry 42 determines that the above conditions are not met it is concluded that the determined fingerprint and the known fingerprint do not correspond to an identical device and the circuitry continues to 94.

As discussed above, at 93, the circuitry 42 determined that the device corresponding to the determined fingerprint is identified as the device of the known fingerprint.

At 94, the circuitry 42 determines that no identical fingerprint is found. For example, because the conditions for the noise level at 92 are not met, therefore, it is determined that no identical fingerprint is found and the circuitry 42 stores the determined fingerprint at 95. At 95, the circuitry 42 stores the determined fingerprint as a fingerprint for a new device in the database 47.

Figure 8:
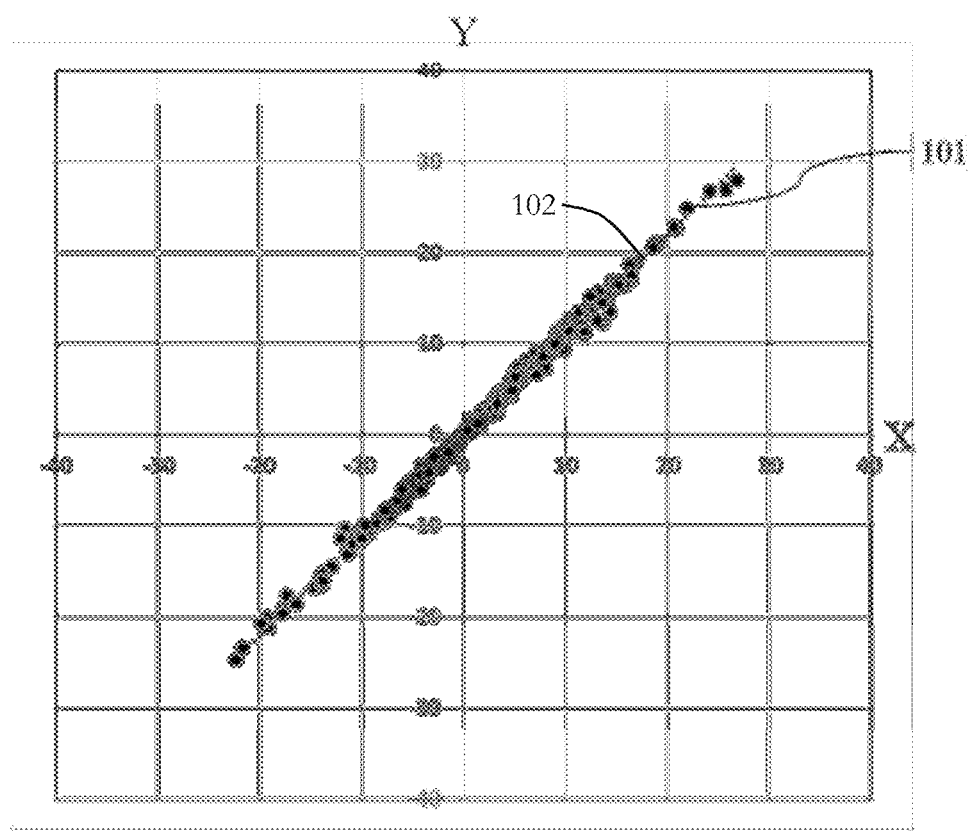
FIG. 8 is an explanatory diagram, where a correlation between a voltage offset distribution pattern of a determined fingerprint and a voltage offset distribution pattern of a known fingerprint yields a linear relationship.

FIG. 8 illustrates an explanatory diagram where a linear relationship is formed between a distribution pattern of a predefined set of voltage offsets of a determined fingerprint and a distribution pattern of a predefined set of voltage offsets of a known fingerprint.

The Y-axis in the FIG. 8 shows the voltage offset distribution pattern of the determined fingerprint and the X-axis shows the voltage offset distribution pattern of the known fingerprint, which is obtained from the database 47.

In FIG. 8, the determined fingerprint is correlated with the known fingerprint resulting in the correlated voltage offset distribution values denoted with 101 in FIG. 8.

Applying a linear regression model, for example, by the circuitry 42, as discussed above, results in the line 102. Next, the R-square is calculated to be, e.g. 0.9955 (99.55%), since the R-square value is greater than 0.9 ($R^2$>90%), therefore, it is assumed that a linear relationship exists between the voltage offset distribution pattern of the determined fingerprint and the voltage offset distribution pattern of the known fingerprint, wherein the known fingerprint corresponds to a known device.

Moreover, in order to check the validity of the linear regression model (or, as discussed above, to find the best fitting known fingerprint in the case that more than one fingerprint having a R-square value larger than 0.9 exists), the slope, the intercept and the error values are calculated, and are in this example, e.g.: the slope is 1.0997, RMSE is 0.64, intercept is 0.008, maximum residual error is 2.5, and minimum residual error is −2.7. Therefore, all linear regression equation parameters including the R-square value, slope and intercept, confirm that there is a linear relationship between the voltage offset distribution pattern of the determined fingerprint and the voltage offset distribution pattern of the known fingerprint, as discussed above. Moreover, the estimated errors including RMSE, maximum residual error and minimum residual error confirm the validity of the applied linear regression model.

As a result, the determined fingerprint and the known fingerprint are determined to correspond to an identical device, as discussed above, and the determined fingerprint and the associated device are identified.

Figure 9:
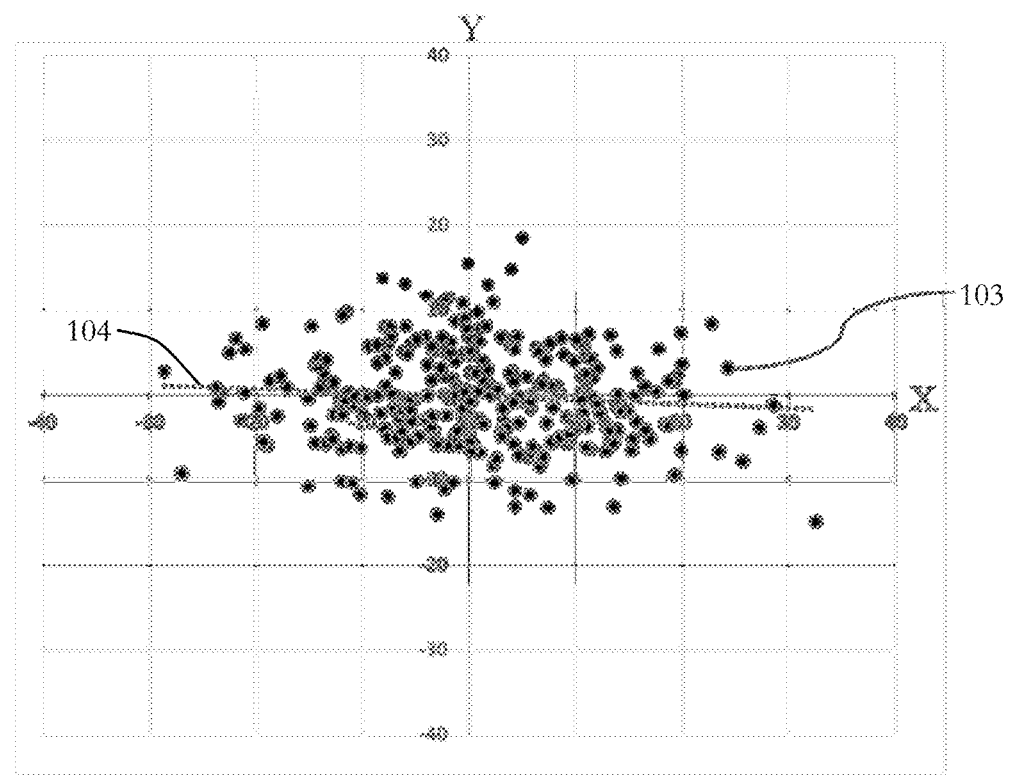
FIG. 9 is an explanatory diagram, where a correlation between a voltage offset distribution pattern of a determined fingerprint and a voltage offset distribution pattern of a known fingerprint does not yield a linear relationship.

FIG. 9 illustrates the same situation as FIG. 8 for a case where no linear relationship is found between the distribution pattern of a predefined set of voltage offsets of the determined fingerprint and the known fingerprint.

As for FIG. 8, the Y-axis in FIG. 9 is the voltage offset distribution pattern of the determined fingerprint and the X-axis is the voltage offset distribution pattern of the known fingerprint which is obtained from the database 47.

In FIG. 9, the determined fingerprint is correlated with the known fingerprint resulting in the correlated voltage offset distribution values denoted with 103 in FIG. 9.

Applying a linear regression model, for example by the circuitry 42, as discussed above, results in line 104. Next, the R-square is calculated to be 0.74%, since the R-square value is not greater than 90%, therefore, it is determined that no linear relationship exists between the voltage offset distribution pattern of the determined fingerprint and the voltage offset distribution pattern of the known fingerprint.

Moreover, the other parameters of the linear regression model are estimated to be as: the slope is −0.0461, RMSE is 5.68, intercept is −0.163, maximum residual error is 14.1, and minimum residual error is −18.9. Therefore, from the linear regression equation parameters including R-square value, slope and intercept it is concluded that there is no linear relationship between the voltage offset distribution pattern of the determined fingerprint and the voltage offset distribution pattern of the known fingerprint, as discussed above.

As a result, the determined fingerprint and the known fingerprint are determined to not correspond to an identical device, as discussed above.

Figure 10:
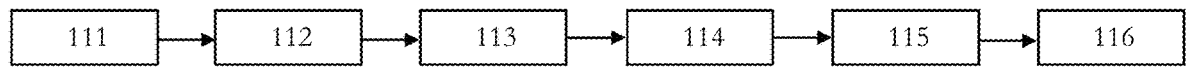
FIG. 10 is a flowchart illustrating an embodiment of tracking an image sensor based on its determined fingerprint.

FIG. 10 is a flowchart illustrating a use case scenario for tracking an image sensor based on its determined fingerprint in accordance with the present disclosure.

The fingerprint of the image sensor may be determined and it may further be correlated to the known fingerprints in a database, as discussed above. Since, the fingerprint of the image sensor can be determined in different stages, therefore, an image sensor may be tracked based on its determined fingerprint at different stages, as follows.

At 111, the image sensor 20 is designed. For example, the configuration, the number of the ADCs, etc., have been designed.

At 112, a wafer for the image sensor has been produced, for example by a CMOS method, as discussed above. In this step, the image sensor includes a plurality of ADCs and the voltage offsets of ADCs may be calculated and a fingerprint for the image sensor may be determined, as discussed above.

At 113, the image sensor is packed. The fingerprint of the image sensor may be determined in this step and the production step may be confirmed.

At 114, the image sensor is modulated. For example, the image sensor may be modulated in a circuitry. The fingerprint of the image sensor may be determined at this stage and, for example, the manufacturing company may be confirmed.

At 115, the final product has been produced. The image sensor, for example, may be used in a digital camera, in a smart phone, etc. The fingerprint of the image sensor may be determined and, for example, the assembling company may be confirmed.

At 116, a customer receives the final product containing a trackable image sensor.

It should be recognized that the embodiments describe methods with an exemplary ordering of method steps. The specific ordering of method steps is however given for illustrative purposes only and should not be construed as binding. For example, the ordering of 83 and 84 in the embodiment of FIG. 7 may be exchanged. Also, the ordering of 87, 89 and 90 in the embodiment of FIG. 7 may be exchanged. Further, also the ordering of 70 and 71 in the embodiment of FIG. 6 may be exchanged. Other changes of the ordering of method steps may be apparent to the skilled person.

Please note that the division of the circuitry 42 into units 43 to 45 is only made for illustration purposes and that the present disclosure is not limited to any specific division of functions in specific units. For instance, the circuitry 42 could be implemented by a respectively programmed processor, field programmable gate array (FPGA), and the like.

A method for controlling an electronic device, such as apparatus 41 discussed above, can also be implemented as a computer program causing a computer and/or a processor and/or circuitry, such as processor 43 discussed above, to perform the method, when being carried out on the computer and/or processor and/or circuitry. In some embodiments, also a non-transitory computer-readable recording medium is provided that stores therein a computer program product, which, when executed by a processor, such as the processor described above, causes the method described to be performed.

All units and entities described in this specification and claimed in the appended claims can, if not stated otherwise, be implemented as integrated circuit logic, for example on a chip, and functionality provided by such units and entities can, if not stated otherwise, be implemented by software.

In so far as the embodiments of the disclosure described above are implemented, at least in part, using software-controlled data processing apparatus, it will be appreciated that a computer program providing such software control and a transmission, storage or other medium by which such a computer program is provided are envisaged as aspects of the present disclosure.

Note that the present technology can also be configured as described below.

(1) A device, comprising:
a plurality of analog-to-digital converters, each of the plurality of analog-to-digital converters having a voltage offset, wherein a predefined set of voltage offsets has a voltage offset distribution pattern providing a fingerprint for the device.
(2) The device of (1), wherein the voltage offset distribution pattern is random.
(3) The device of (1) or (2), wherein the random voltage offset distribution pattern is unique for the device.
(4) The device of anyone of (1) to (3), further comprising a semiconductor chip including the plurality of analog-to-digital converters.
(5) The device of anyone of (1) to (4), wherein the semiconductor chip is an image sensor including a plurality of pixels, wherein each of the plurality of pixels include at least one of the plurality of analog-to-digital converters.
(6) The device of anyone of (1) to (5), wherein the voltage offsets of the predefined set of voltage offsets are distributed within a value range of −60 mV and +60 mV.
(7) The device of anyone of (1) to (6), further comprising an image sensor, wherein the plurality of analog-to-digital converters corresponds to a plurality of pixels of the image sensor.
(8) The device of anyone of (1) to (7), wherein the plurality of analog-to-digital converters corresponds to non-active pixels of the image sensor.
(9) The device of anyone of (1) to (8), wherein the image sensor is a time-of-flight sensor including the plurality of analog-to-digital converters.
(10) A method, comprising:
determining a fingerprint for a device including a plurality of analog-to-digital converters, based on a voltage offset distribution pattern of a predefined set of voltage offsets provided by the plurality of analog-to-digital converters.
(11) The method of (10), further comprising storing the determined fingerprint in a database.
(12) The method of (10) or (11), wherein the fingerprint is represented by the predefined set of voltage offsets.
(13) The method of anyone of (10) to (12), further comprising receiving a known fingerprint from a database, wherein the known fingerprint is based on a voltage offset distribution pattern of a predefined set of voltage offsets provided by a plurality of analog-to-digital converters of a device.
(14) The method of anyone of (10) to (13), further comprising identifying the device for which the fingerprint has been determined.
(15) The method of anyone of (10) to (14), wherein the identifying is based on a correlation of the determined fingerprint and the known fingerprint.
(16) The method of anyone of (10) to (15), wherein the correlation is based on a statistical model.
(17) The method of anyone of (10) to (16), wherein the statistical model is based on a linear regression model.
(18) The method of anyone of (10) to (17), further comprising calculating at least one parameter of the linear regression model.
(19) The method of anyone of (10) to (18), wherein the calculated parameter of the linear regression model is an R-square value.
(20) The method of anyone of (10) to (19), wherein the correlation includes determining a linear relationship between the voltage offset distribution pattern of the predefined set of voltage offsets of the known fingerprint and the voltage offset distribution pattern of the predefined set of voltage offsets of the determined fingerprint.
(21) The method of anyone of (10) to (20), further comprising storing the determined fingerprint as a fingerprint for a new device in the database when the device is not identified.
(22) The method of anyone of (10) to (21), wherein the device is identified when a correlation evaluation score is larger than a predetermined value.
(23) The method of anyone of (10) to (22), wherein the identifying includes estimating an error for the linear regression model.
(24) The method of anyone of (10) to (23), wherein the device is identified, when the error is lower than a predetermined error threshold value.
(25) A computer program comprising program code causing a computer to perform the method according to anyone of (10) to (24), when being carried out on a computer.
(26) A non-transitory computer-readable recording medium that stores therein a computer program product, which, when executed by a processor, causes the method according to anyone of (10) to (24) to be performed.
(27) An apparatus comprising circuitry configured to perform the method of anyone of (10) to (24).

The invention claimed is:

1. A device, comprising:
a semiconductor chip comprising a plurality of analog-to-digital converters, each of the plurality of analog-to-digital converters having an intrinsic voltage offset, wherein the intrinsic voltage offsets for the analog-to-digital converters collectively form a predefined set of voltage offsets having a voltage offset distribution pattern providing a fingerprint for the device, wherein the voltage offset distribution is a random pattern in which a location and magnitude of the intrinsic voltage offsets is randomly distributed over the plurality of analog-to-digital converters,
wherein a value of each of the voltage offsets of the predefined set of voltage offsets is within a range from −60 mV to 60 mV.

2. The device of claim 1, wherein the voltage offset distribution pattern is unique for the device.

3. The device of claim 1, further comprising an image sensor, wherein the plurality of analog-to-digital converters corresponds to a plurality of pixels of the image sensor.

4. The device of claim 3, wherein the plurality of analog-to-digital converters corresponds to non-active pixels of the image sensor.

5. The device of claim 3, wherein the image sensor is a time-of-flight sensor including the plurality of analog-to-digital converters.

6. A method, comprising:
determining a fingerprint for a device, the device comprising a semiconductor chip comprising a plurality of analog-to-digital converters, each of the plurality of analog-to-digital converters having an intrinsic voltage offset, wherein the intrinsic voltage offsets for the analog-to-digital converters collectively form a predefined set of voltage offsets having a voltage offset distribution pattern providing the fingerprint for the device, wherein the voltage offset distribution is a random pattern in which a location and magnitude of the intrinsic voltage offsets is randomly distributed over the plurality of analog-to-digital converters,
wherein a value of each of the voltage offsets of the predefined set of voltage offsets is within a range from −60 mV to 60 mV.

7. The method of claim 6, further comprising storing the determined fingerprint in a database.

8. The method of claim 7, wherein the fingerprint is represented by the predefined set of voltage offsets.

9. The method of claim 6, further comprising receiving a known fingerprint from a database, wherein the known fingerprint is based on a voltage offset distribution pattern of a predefined set of voltage offsets provided by a plurality of analog-to-digital converters of a device.

10. The method of claim 9, further comprising identifying the device for which the fingerprint has been determined.

11. The method of claim 10, wherein the identifying is based on a correlation of the determined fingerprint and the known fingerprint.

12. The method of claim 11, wherein the correlation is based on a statistical model.

13. The method of claim 12, wherein the statistical model is based on a linear regression model.

14. The method of claim 13, further comprising calculating at least one parameter of the linear regression model.

15. The method of claim 14, wherein the calculated parameter of the linear regression model is an R-square value.

16. The method of claim 11, wherein the correlation includes determining a linear relationship between the voltage offset distribution pattern of the predefined set of voltage offsets of the known fingerprint and the voltage offset distribution pattern of the predefined set of voltage offsets of the determined fingerprint.

17. The method of claim 11, further comprising storing the determined fingerprint as a fingerprint for a new device in the database, when the device is not identified.

18. The method of claim 11, wherein the device is identified when a correlation evaluation score is larger than a predetermined value.

19. The method of claim 13, wherein the identifying includes estimating an error for the linear regression model.

20. The method of claim 6, wherein each of the plurality of analog-to-digital converters includes two inputs, and wherein determining a fingerprint for the device comprises, for each of the plurality of analog-to-digital converters:
applying a same voltage to the two inputs of analog-to-digital converter; and
measuring an output voltage of the analog-to-digital converter as the digital offset of the analog-to-digital converter.

* * * * *